United States Patent [19]
Sparks

[11] Patent Number: 6,008,697
[45] Date of Patent: Dec. 28, 1999

[54] CIRCUIT ARRANGEMENT COMPRISING A POWER AMPLIFIER STAGE

[75] Inventor: Geoffrey S. Sparks, Cambridge, United Kingdom

[73] Assignee: U.S. Philips Corporation, New York, N.Y.

[21] Appl. No.: 09/029,528

[22] PCT Filed: Jun. 18, 1997

[86] PCT No.: PCT/IB97/00730

§ 371 Date: Feb. 27, 1998

§ 102(e) Date: Feb. 27, 1998

[87] PCT Pub. No.: WO98/00907

PCT Pub. Date: Jan. 8, 1998

[30] Foreign Application Priority Data

Jun. 28, 1996 [EP] European Pat. Off. .............. 96110470

[51] Int. Cl.⁶ ..................................................... H03G 3/30

[52] U.S. Cl. ............................ 330/279; 330/129; 455/126
[58] Field of Search .................................... 330/129–132, 330/279; 455/126; 4/127

[56] References Cited

U.S. PATENT DOCUMENTS

| | | | |
|---|---|---|---|
| 5,212,814 | 5/1993 | Iwane | 455/126 |
| 5,469,105 | 11/1995 | Sparks | 330/129 |
| 5,507,017 | 4/1996 | Whitmarsh et al. | 455/126 |

Primary Examiner—Robert Pascal
Assistant Examiner—Khanh Van Nguyen
Attorney, Agent, or Firm—Dicran Halajian

[57] ABSTRACT

A circuit arrangement includes a power amplifier stage, a feedback path, a re-combining stage, first and second gain control elements and a control circuit. The first gain control element is formed by an adjustable delay element which is preceded by a constant gain amplifier.

15 Claims, 1 Drawing Sheet

CIRCUIT ARRANGEMENT COMPRISING A POWER AMPLIFIER STAGE

BACKGROUND OF THE INVENTION

This invention relates to a circuit arrangement comprising a power amplifier stage located on a forward gain path arranged between a signal input and a signal output, a feedback path, connecting the signal output to the signal input, and comprising an extraction stage for extracting part of a signal from the output of the power amplifier stage to the feedback path, and comprising a feedback function stage, a re-combining stage for re-combining a feedback signal from the output of the feedback path with an external input signal, an output of the recombining stage being coupled to the signal input of the power amplifier stage, a first gain control element in the forward gain path, a second gain control element in the feedback path, and a control circuit which varies the first and second gain control elements inversely, so that the product of their gain factors remains constant, in essence.

From European Patent Application 0 638 994, to whose overall disclosure content is expressly referred hereby, is known such a circuit arrangement of the type disclosed in the first claim. This circuit arrangement is to achieve a linearization of the transmission characteristic of the power amplifier stage. Since the gain factors of the gain control elements are varied inversely, so that their product remains substantially constant, there is additionally achieved that the feedback loop (formed by forward gain path, feedback path and re-combining stage) formed by the circuit arrangement is also operated with different powers transmitted via the power amplifier stage with constant signal levels on the signal input and is thus capable of operating at a signal level to which it is optimally designed.

SUMMARY OF THE INVENTION

It is an object of the invention to arrange the circuit arrangement described above so that a further improvement of the operating behavior is achieved, particularly with respect to noise.

According to the invention, a solution to this objective is that the first gain control element is formed by an adjustable delay element which is preceded in the forward gain path by a low-noise amplifier stage which has a substantially constant gain factor. Losses in downstream elements in the forward gain path are overcompensated for by the gain factor of the low-noise amplifier stage. The low-noise increase of the signal level in the low-noise amplifier stage provides an improvement of the signal-to-noise ratio in this part of the forward gain path.

The invention is particularly advantageous if the circuit arrangement is embodied as a Cartesian loop. As shown in the publication EP 0 638 994, a summing stage is inserted into the forward gain path between the up-converters for the Cartesian components of the signal to be amplified and the power amplifier stage. Losses occurring in this summing stage are overcompensated for according to the invention in that between the mixers for the quadrature components of the signal to be amplified and the summing stage, low-noise amplifiers are inserted which form the low-noise amplifier stage in the forward gain path. This improves the noise characteristic in the range of the summing stage.

According to a further embodiment of the invention, the control circuit does not only maintain the product of the gain factors of the first and second gain control elements at a constant level, but also the gain factor of the power amplifier stage is incorporated in this product which is maintained at a constant level. As a result, variations in the gain of the power amplifier stage, caused, for example, by temperature variations or ageing, can be compensated for, so that the overall transmission behavior of the circuit arrangement becomes more constant.

Preferably, a circuit arrangement according to the invention is used within a transmitter power amplifier of a transmitter apparatus. Such a transmitter can advantageously be used in a telecommunication apparatus.

BRIEF DESCRIPTION OF THE DRAWING

An illustrative embodiment is represented in the single FIGURE of the drawing and will be further described in the following.

DESCRIPTION OF THE PREFERRED EMBODIMENT

Figure 1:
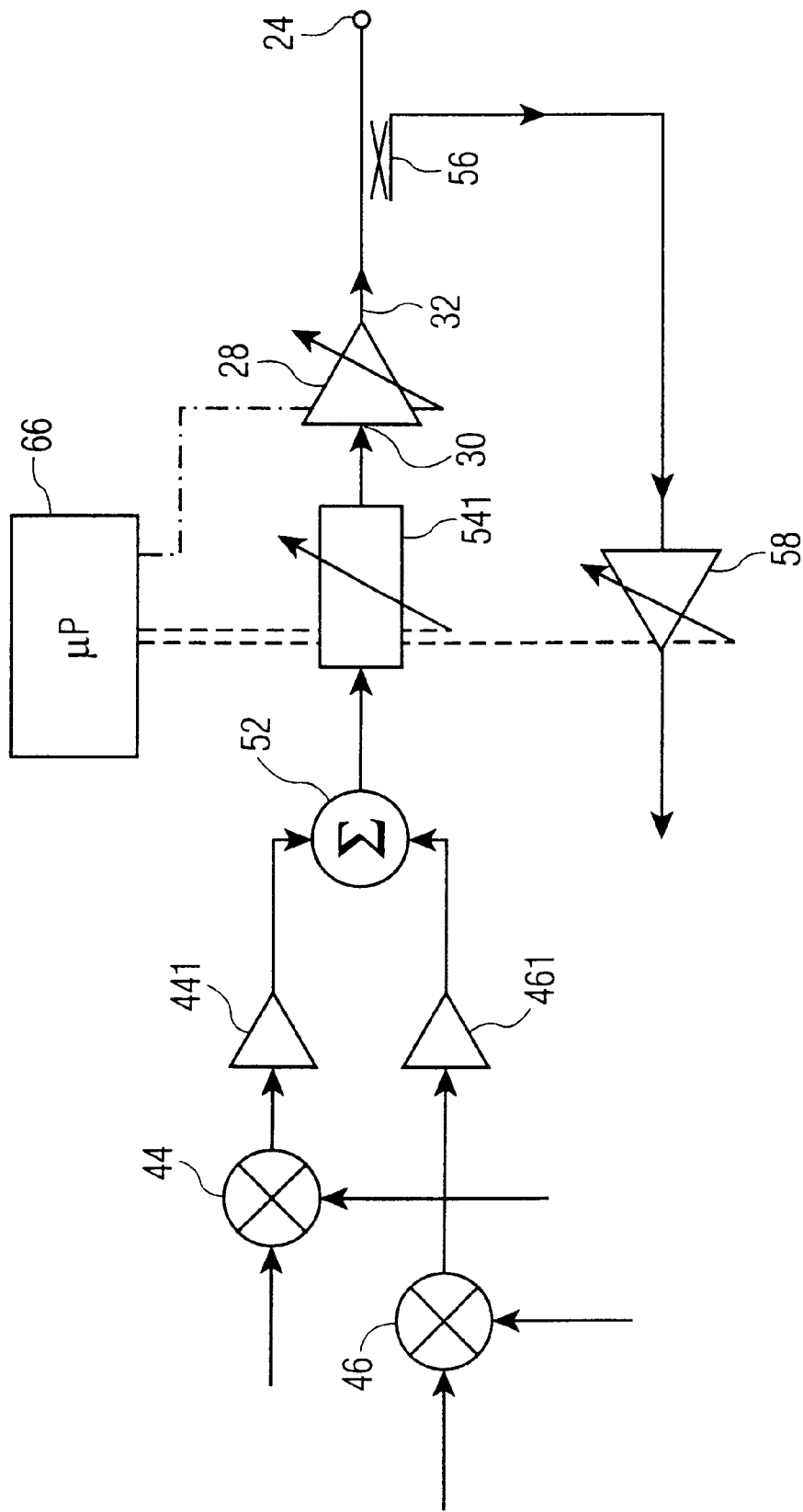

This FIGURE shows a section of the FIGURE of EP 0 638 994 A1 in which the elements known from that document are referenced by the characters used there. Only the section of the FIGURE in which the modifications according to this invention are used are shown. The forward gain path comprises the mixers 44 and 46 for the quadrature components of the signal to be amplified. The output signals of the mixers 44 and 46 are applied according to the present invention to a summing stage 52 via a low-noise amplifier 441, 461 respectively, and additively combined in that stage. From the summing stage 52, the sum signal goes via an adjustable attenuation element 541 to an input 30 of the power amplifier stage 28 and from the amplifier stage output 32 via a coupler 56 partly to an output 24 which can be connected to an antenna and partly to the second gain control element 58.

The adjustable attenuation element 541 and the second gain control element 58 are varied inversely by a control circuit 66 in the manner known from EP 0 638 994 A1. This control circuit 66 may preferably comprise a microprocessor.

In a modification of the illustrative embodiment shown, also the power amplifier stage 28 can be controlled by the control circuit 66. The control circuit varies the gain factors of the delay element 541 (first gain control element), of the second gain control element 58 and of the power amplifier stage 28 in such a way that its product remains substantially constant. Preferably, the control circuit can also make a measurement of the gain factor of the power amplifier stage, i.e. an evaluation of the ratio of the signal amplitudes on the output 32 and input 30. The thus established actual value of the gain factor of the power amplifier stage may then be used as a basis for the setting of the gain factor of the two gain control elements.

What is claimed is:

1. A power amplifier circuit arrangement comprising:

a power amplifier stage connected in a forward gain path coupled between a signal input terminal and a signal output terminal, a feedback path, connecting the signal output terminal to the signal input terminal, and comprising an extraction stage for extracting a part of the output of the power amplifier stage as a feedback signal supplied to the feedback path and a feedback function stage, a combining stage for combining the feedback signal from an output of the feedback path with an external input signal, means coupling an output of the combining stage to the signal input of the power amplifier stage, a first gain control element connected in the forward gain path, a second gain control element connected in the feedback path, and a control circuit for controlling the first and second gain control elements inversely so that the product of their gain factors remains constant, in essence,, characterized in that the first gain control element comprises an adjustable delay element which is preceded in the forward gain path by a low-noise amplifier stage which has a substantially constant gain factor.

2. A power amplifier circuit arrangement as claimed in claim 1, wherein the gain of the power amplifier stage is variable and the control circuit controls the product of the gain factors of the first and second gain control elements and the gain factor of the power amplifier stage such that the product of their gain factors is substantially constant.

3. A power amplifier circuit arrangement as claimed in claim 1, characterized by a Cartesian loop architecture.

4. A transmitter comprising a power amplifier circuit as claimed in claim 1.

5. A telecommunication apparatus, characterized by a transmitter as claimed in claim 4.

6. The power amplifier circuit as claimed in claim 1 wherein the combining stage, the low-noise amplifier stage, the first gain control element and the power amplifier stage are connected in a first series circuit in the forward gain path between the signal input terminal and the signal output terminal, and the extraction stage, the second gain control element and the feedback function stage are connected in a second series circuit in the feedback path.

7. A power amplifier circuit comprising: a forward gain path including a power amplifier output stage having an input and an output and a feedback loop, the feedback loop including means for deriving a portion of the power amplifier's output and a feedback function stage, means for combining an output of the feedback loop with a signal applied to an input terminal of the forward gain path, the forward gain path further including a low noise amplifying means having a substantially constant gain factor and an adjustable attenuation element having an input coupled to an output of the low noise amplifying means and an output coupled to the input of the power amplifier, the feedback further including a gain control element, and a control circuit for controlling the adjustable attenuation element and the gain control element so that the gain product thereof remains substantially constant.

8. A power amplifier circuit as claimed in claim 7, wherein the power amplifier output stage has an input for a gain adjustment signal supplied by the control circuit, and wherein the control circuit controls the adjustable attenuation element and the gains of the gain control element and the power amplifier output stage such that their product has a substantially constant value.

9. A power amplifier circuit as claimed in claim 7, having a Cartesian loop structure, wherein the forward gain path includes first and second quadrature related frequency up-converters coupled to the combining means, the low noise amplifying means comprises first and second low noise amplifiers respectively coupled to outputs of the first and second frequency up-converters, and wherein summing means is coupled to outputs of the low noise amplifiers and to the input of the adjustable attenuation element.

10. A transmitter comprising a forward gain path including a power amplifier having an input and an output and a feedback loop including means for deriving a portion of the power amplifier's output and a feedback function stage, means for combining an output of the feedback loop with a modulating signal applied to an input of the forward gain path, the forward gain path further including a low noise amplifying means having a substantially constant gain factor and an adjustable attenuation element having an input coupled to an output of the low noise amplifying means and an output coupled to the input of the power amplifier, the feedback path further including a gain control element, and a control circuit for controlling the adjustable attenuation element and the gain control element.

11. A transmitter as claimed in claim 10, wherein the power amplifier has an input for a gain adjustment signal supplied by the control circuit, and wherein the control circuit controls the adjustable attenuation element and the gains of the gain control element and the power amplifier such that their product has a substantially constant value.

12. A transmitter as claimed in claim 10, having a Cartesian loop structure, wherein the forward gain path includes first and second quadrature related frequency up-converters coupled to the combining means, the low noise amplifying means comprises first and second low noise amplifiers respectively coupled to outputs of the first and second frequency up-converters, and wherein summing means is coupled to outputs of the low noise amplifiers and to the input of the adjustable attenuation element.

13. A telecommunications apparatus comprising a radio transmitter comprising a forward gain path including a power amplifier having an input and an output and signal propagation means coupled to said output, and a feedback loop including means for deriving a portion of the power amplifier's output and a feedback function stage, means for combining an output of the feedback loop with a modulating signal applied to an input of the forward gain path, the forward gain path further including a low noise amplifying means having a substantially constant gain factor and an adjustable attenuation element having an input coupled to an output of the low noise amplifying means and an output coupled to the input of the power amplifier, the feedback path further including a gain control element, and a control circuit for controlling the adjustable attenuation element and the gain control element.

14. A telecommunications apparatus as claimed in claim 13, wherein the power amplifier has an input for a gain adjustment signal supplied by the control circuit, and wherein the control circuit controls the adjustable attenuation element and the gains of the gain control element and the power amplifier such that their product has a substantially constant value.

15. A telecommunications apparatus as claimed in claim 13, having a Cartesian loop structure, wherein the forward gain path includes first and second quadrature related frequency up-converters coupled to the combining means, the low noise amplifying means comprises low noise amplifiers respectively coupled to outputs of the first and second frequency up-converters, and wherein summing means is coupled to outputs of said low noise amplifiers and to the input of the adjustable attenuation element.

* * * * *